United States Patent
Kim et al.

(10) Patent No.: US 8,101,536 B2
(45) Date of Patent: Jan. 24, 2012

(54) GLASS-FREE MICROWAVE DIELECTRIC CERAMICS AND THE MANUFACTURING METHOD THEREOF

(75) Inventors: Hyo Tae Kim, Gyeonggi-do (KR); Jong Hee Kim, Seoul (KR); Myung Hwa Nam, Seoul (KR)

(73) Assignee: Korea Institute of Ceramic Engineering & Technology (KR)

( * ) Notice: Subject to any disclaimer, the term of this patent is extended or adjusted under 35 U.S.C. 154(b) by 97 days.

(21) Appl. No.: 12/516,295

(22) PCT Filed: Nov. 22, 2007

(86) PCT No.: PCT/KR2007/005906
§ 371 (c)(1),
(2), (4) Date: Dec. 15, 2009

(87) PCT Pub. No.: WO2008/066282
PCT Pub. Date: Jun. 5, 2008

(65) Prior Publication Data
US 2010/0120607 A1    May 13, 2010

(30) Foreign Application Priority Data
Nov. 30, 2006 (KR) .................. 10-2006-0120128

(51) Int. Cl.
*C04B 35/453* (2006.01)
*C04B 35/457* (2006.01)
*C04B 35/465* (2006.01)
*C04B 35/486* (2006.01)

(52) U.S. Cl. ........ 501/135; 501/136; 501/137; 501/138; 501/139

(58) Field of Classification Search .................. 501/136, 501/137, 138, 139, 135
See application file for complete search history.

(56) References Cited

U.S. PATENT DOCUMENTS
7,155,816 B2 * 1/2007 Ninomiya et al. .............. 29/830
(Continued)

FOREIGN PATENT DOCUMENTS
JP       61091528    * 5/1986
(Continued)

OTHER PUBLICATIONS

The International Search Report issued in connection with PCT/KR2007/005906 on Feb. 28, 2008.

(Continued)

*Primary Examiner* — Karl Group
(74) *Attorney, Agent, or Firm* — The H.T. Than Law Group

(57) ABSTRACT

A glass-free microwave dielectric ceramic that can be sintered at low temperature is provided. The glass-free microwave dielectric ceramic composition includes $(M_{1-x}^{2+}M'_x{}^{2+})N^{4+}B_2O_6$ (wherein M and M' are different each other, each being one among Ba, Ca and Sr; N is one among Sn, Zr and Ti; and 0<x<1), $M^{2+}(N_{1-y}^{4+}N'_y{}^{4+})B_2O_6$ (wherein M is one among Ba, Ca and Sr; N and N' are different from each other, each being one among Sn, Zr and Ti; and 0<y<1), or $(M_{1-x}^{2+}M'_x{}^{2+})(N_{1-y}^{4+})B_2O_6$ (wherein M and M' are different from each other, each being one among Ba, Ca and Sr; N and N' are different from each other, each being one among Sn, Zr and Ti; 0<x<1; and 0<y<1). In addition, the glass-free microwave dielectric ceramic composition may further includes approximately 1 wt % to approximately 7 wt % of a sintering aid represented by a formula, $0.12CuO+0.88Bi_2O_3$. As such, the glass-free microwave dielectric ceramic composition may be sintered at a low temperature at lowest 875° C.

12 Claims, 4 Drawing Sheets

U.S. PATENT DOCUMENTS

2004/0089472 A1 * 5/2004 Ninomiya et al. ............ 174/266

FOREIGN PATENT DOCUMENTS

| JP | 63280488 | * | 11/1988 |
| JP | 01183448 | * | 7/1989 |
| JP | 2000203878 A | | 7/2000 |
| JP | 2000252106 A | | 9/2000 |

OTHER PUBLICATIONS

Nam, Myung-Hwa et al. Low-Temperature Sintering and Dielectric Properties of BaSn(BO3)2. Journal of the Korean Ceramic Society. Feb. 2006, vol. 43, No. 2, pp. 92-97.
Translated Abstract for JP 2000203878, Jul. 2000.
Translated Abstract for JP 2000252106, Sep. 2000.

* cited by examiner

GLASS-FREE MICROWAVE DIELECTRIC CERAMICS AND THE MANUFACTURING METHOD THEREOF

This application claims priority to international patent application no. PCT/KR2007/005906 filed on Nov. 22, 2007 and to Korean patent application no. KR 10-2006-0120128 filed on Nov. 30, 2006. The disclosures of these applications are incorporated herein by reference in their entireties.

TECHNICAL FIELD

The present disclosure relates to a microwave dielectric ceramics and a manufacturing method thereof, and more particularly, to a glass-free microwave dielectric ceramics which can be sintered together with an internal conductor and has superior microwave dielectric characteristics, and a manufacturing method thereof.

BACKGROUND ART

Recently, as a market for mobile communication terminals, such as a mobile phone and a personal digital assistant (PDA), and Bluetooth products for facilitating ubiquitous communications is growing rapidly, high-frequency devices constituting them, such as a microwave filter, a duplexer, a resonator, and an integrated circuit board are required to become smaller and lighter, and to be stacked and surface-mounted.

Such high-frequency devices include dielectric ceramic materials. The dielectric ceramics for the high-frequency devices should have specific dielectric characteristics as follows.

First, in order to reduce the device size, the dielectric ceramics should have a high dielectric constant, $\epsilon_r$. This is because a wavelength of the microwave in the dielectric ceramics is decreased in inverse proportion to the square root of the dielectric constant. However, a microwave transmission line provided to a board of radio frequency (RF)/microwave module should rather have a low dielectric constant so as to increase the speed.

Second, for a highly efficient operation, the dielectric ceramics should have a high quality factor (Q) within an operation frequency range. In other words, the dielectric ceramics should have a low dielectric loss, tan δ, which is a reciprocal of the quality factor. In general, the quality factor is evaluated based on the product of the quality factor and a corresponding resonance frequency, Q×f, or the dielectric loss, a reciprocal of the quality factor.

Third, for an accurate operation of the operation frequency, the dielectric ceramics should have a temperature coefficient factor (TCF) of the resonance frequency, $\tau_f$, close to zero.

Meanwhile, a method for stacking high-frequency devices under development in recent times includes printing a conductive pattern on a green sheet of dielectric ceramics, stacking the printed green sheets, and then sintering them. This method allows lots of elements such as an inductor, a capacitor and a resistor to be integrated in a single module without additional lead wire. Accordingly, the package size can be reduced significantly.

However, the method requires that an internal conductor formed of silver (Ag) or copper (Cu) having excellent conductivity should be sintered together with the dielectric ceramics. Accordingly, a low temperature co-fired ceramics (LTCC) is demanded strongly. The LTCC can be sintered at a temperature lower than approximately 950° C., however, has a high quality factor and a low resonance frequency. However, most of the recently developed LTCC suffers from significantly deteriorated microwave dielectric characteristics, such as insufficient densification, low dielectric constant clue to the addition of sintering agents, lowered quality factor, increased temperature coefficient factor of the resonance frequency, and the like.

Furthermore, the typical LTCC is formed of ceramic materials having a composite structure including a glass matrix and an alumina ($Al_2O_3$) powder filler mixed thereto. However, this typical LTCC is reported to suffer from difficulty in controlling rheology during the ceramic slurry formation, ununiform glass composition, ununiform dispersion, and the like. Consequently, a glass-free (or non-glass) LTCC composition including no glass or minimum amount of glass is attracting considerable interests.

DISCLOSURE

Technical Problem

Accordingly, the present disclosure provides a glass-free microwave dielectric ceramics having superior microwave dielectric characteristics, and a manufacturing method thereof.

The present disclosure also provides a low temperature co-fired microwave dielectric ceramics that can be sintered at low temperature by adding a low temperature sintering agent to the glass-free microwave dielectric ceramics, and a manufacturing method thereof.

Technical Solution

Embodiments provide a microwave dielectric ceramics includes $M^{2+}N^{4+}B_2O_6$ component, where M may be substituted for by two different divalent metals and/or N may be substituted for by two different tetravalent metals.

Advantageous Effects

A microwave dielectric ceramic in accordance with an exemplary embodiment includes $M^{2+}N^{4+}B_2O_6$ composition. Here, M may be replaced by two divalent metals different from each other and/or N may be replaced by two tetravalent metals different from each other. As such, the microwave dielectric ceramic can have superior microwave dielectric characteristics without a glass matrix, and thus can be advantageously applied to a high-frequency device.

In addition, by adding $Bi_2O_3$—CuO based sintering agent to the microwave dielectric ceramic composition, the microwave dielectric ceramic can be sintered at low temperature without deterioration of dielectric characteristics. Accordingly, the microwave dielectric ceramic can be advantageously applied to a low temperature co-firing ceramic device, which has superior microwave dielectric characteristics.

BEST MODE

Figure 1:
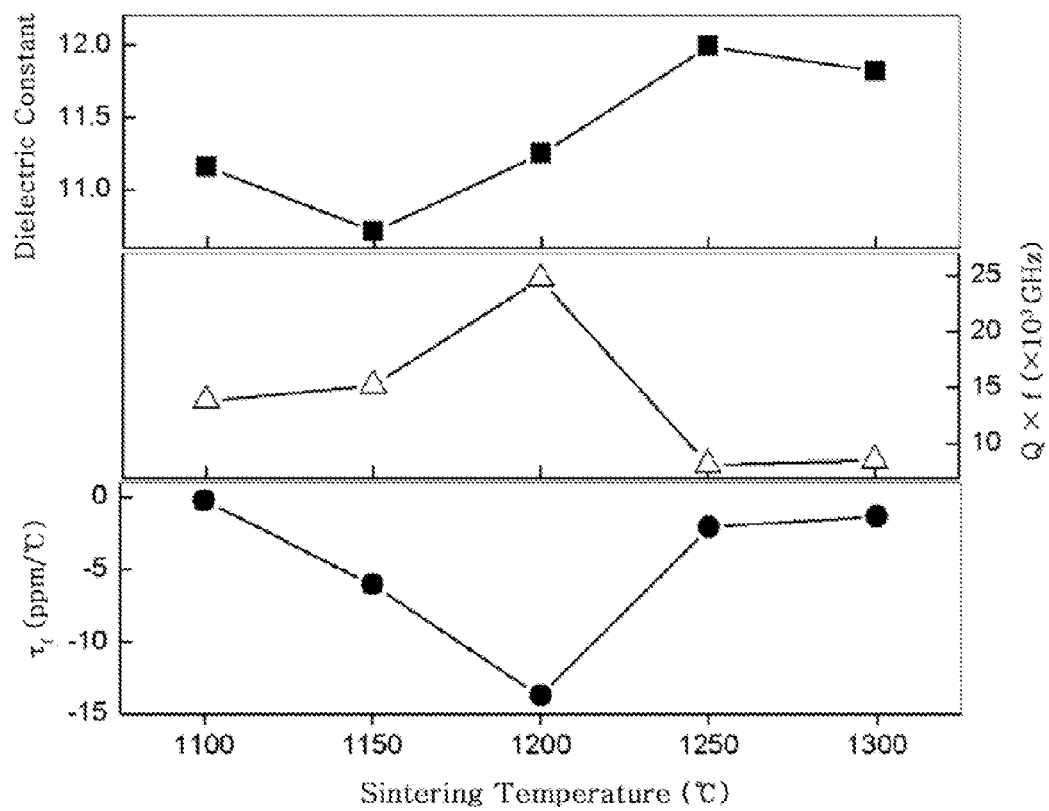
FIG. 1 is a graph illustrating microwave dielectric characteristics of $BaZr(MO_3)_2$ ceramic in accordance with an exemplary embodiment.

In accordance with an exemplary embodiment, a glass-free microwave dielectric ceramic composition includes a composition represented by a formula, $M^{2+}N^{4+}B_2O_6$, wherein M is one element of Ba, Ca and Sr, and N is one element of Sn, Zr and Ti.

The M may be replaced by two elements of Ba, Ca and Sr different from each other, to form a composition represented by a formula, $(M_{1-x}^{2+}M'^{2+}_x)N^{4+}B_2O_6$ (wherein M and M' are different from each other, each being one among Ba, Ca and Sr; N is one among Sn, Zr and Ti; and 0<x<1). The N may also be replaced by two elements of Sn, Zr and Ti different from each other, to form a composition represented by a formula, $M^{2+}(N_{1-y}^{4+}N'^{4+}_y)B_2O_6$ (wherein M is one among Ba, Ca and Sr; N and N' are different from each other, each being one among Sn, Zr and Ti; and 0<y<1). Furthermore, it is also possible that the M is replaced by two elements of Ba, Ca and Sr different from each other, and the N is replaced by two elements of Sn, Zr and Ti different from each other, to form a composition represented by a formula, $M_{1-x}^{2+}M'^{2+}_x)(N_{1-y}^{4+}N'^{4+}_y)B_2O_6$ (wherein M and M' are different from each other, each being one among Ba, Ca and Sr; N and N' are different each other, each being one among Sn, Zr and Ti; 0<x<1; and 0<y<1).

In addition, the glass-free microwave dielectric ceramic composition may further includes a sintering agent represented by a formula, $0.12CuO+0.88Bi_2O_3$. The concentration of the sintering aid in the dielectric ceramic composition may be from 1 wt % to 7 wt %.

In accordance with another exemplary embodiment, a method for manufacturing a glass-free microwave dielectric ceramic material includes: mixing and pulverizing one of the above described dielectric ceramic composition; drying and calcinating the mixed and pulverized dielectric ceramic composition; mixing and pulverizing the dried and calcinated dielectric ceramic composition with a sintering agent represented by a formula, $0.12CuO+0.88Bi_2O_3$, to obtain a sample; drying the sample; molding the dried sample; and sintering the molded sample. The sintering agent may be added in the range of from 1 wt % to 7 wt %. The sintering of the molded sample may be performed at from 875° C. to 1,000° C. As such, the glass-free microwave dielectric ceramic material can be sintered at low temperature without significant deterioration of microwave dielectric characteristics.

MODE FOR INVENTION

A microwave dielectric ceramic in accordance with an exemplary embodiment has a ceramic composition represented by the formula 1:

$$M^{2+}N^{4+}B_2O_6 \quad (1),$$

where M is a divalent metal element such as Ba, Ca, Sr, and the like, and N is a tetravalent metal element such as Sn, Zr, Ti, and the like. The inventors found that the microwave dielectric ceramic has a dolomite structure and an anisotropic thermal expansion characteristic.

Also, the formula 1 may be modified by replacing the metal element M or N by two metal elements different from each other. That is, the formula 1 may be modified in such a manner that the metal element M is replaced by two divalent metal elements different from each other, and/or the metal element N is replaced by two tetravalent metal elements different from each other. In this case, the formula 1 of the microwave dielectric ceramic may be modified into one of the following formulas:

$$(M_{1-x}^{2+}M'^{2+}_x)N^{4+}B_2O_6 \quad (2),$$

$$M^{2+}(N_{1-y}^{4+}N'^{4+}_y)B_2O_6 \quad (3),$$

$$(M_{1-x}^{2+}M'^{2+}_x)(N_{1-y}^{4+}N'^{4+}_y)B_2O_6 \quad (4),$$

where 0<x<1 and 0<y<1. The M and M' may be any divalent metal elements, such as Ba, Ca, Sr, and the like, which are different from each other. The N and N' may be any tetravalent metal elements, such as Sn, Zr, Ti, and the like, which are different from each other.

The inventors found that sintering temperatures of the microwave dielectric ceramics of formulas 1 to 4 are higher than approximately 1,100° C. Such a high sintering temperature makes the ceramics difficult to be applied to LTCC. Therefore, according to the other desirable embodiment of the present invention, in order to lower the sintering temperature, a sintering agent including CuO and $Bi_2O_3$ for a low temperature sintering is added to the composition of the microwave dielectric ceramics having the formulas 1 to 4. The sintering agent can be represented by the following formula:

$$\alpha wt \%(0.12CuO+0.88Bi_2O_3) \quad (5)$$

where 1<α<7.

In summary, the microwave dielectric ceramics of the formulas 1 to 4 are difficult to be used for the LTCC because they have sintering temperatures higher than approximately 1,100° C. However, as a sintering agent including CuO and $Bi_2O_3$ having a eutectic point of approximately 600±20° C. is added to the microwave dielectric ceramics, the sintering temperature can be lowered preferably to between 875° C. and 1,000° C., more preferably to between 875° C. and 925° C., further more preferably to 875° C. During the sintering process, the CuO and $Bi_2O_3$ form a liquid phase in an internal interface of the ceramic to accelerate densification of the ceramic. Consequently, the microwave dielectric ceramic can be sintered at a low temperature with superior microwave dielectric characteristics.

Hereinafter, specific embodiments will be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

EXAMPLES 1 to 5

In these examples, $BaZr(BO_3)_2$ ceramics consisting essentially of the composition of the formula 1 were prepared and sintered at various sintering temperatures, and microwave dielectric characteristics thereof were measured.

In specific, reagents $BaCO_3$, $ZrO_2$, and $B_2O_3$ or $H_3BO_3$ were weighed to form the composition of $BaZr(BO_3)_2$. The weighed reagents were mixed and pulverized with zirconia balls for 24 hours using deionized water as a dispersion solvent. The mixed and pulverized sample was dried, and then calcinated for 4 hours at between 900° C. and 1,150° C. to synthesize a solid solution of a dolomite structure (hexagonal symmetry). The synthesized powder was pulverized again for 24 hours with a wet ball mill to form a fine powder having an average particle diameter of approximately 1 μm. The fine powder was added with 2 wt % of polyvinyl alcohol (PVA) binder aqueous solution, and pressed into a cylinder shape of 10 mm diameter and 5 mm to 6 mm thickness, at 1 ton/cm². The sample of a cylinder shape was heat-treated for 1 hour at 400° C. to remove a binder, and then sintered for 2 hours at a temperature between 1,100° C. and 1,300° C. Both edges of the sintered sample were ground with SiC abrasive paper. Then, dielectric constant ($\epsilon_r$) at 1 MHz, dielectric loss (tan δ), and temperature coefficient of capacitance (TCC) was measured by an impedance analyzer (4294A, Agilent Technologies Inc., USA). Here, the TCC was measured at a temperature range from −25° C. to 125° C. Also, dielectric characteristics in a microwave region were measured by a network analyzer (8720ES, Agilent Technologies Inc., USA) with a post resonator method and a cavity resonator method. Here, the temperature coefficient of resonant frequency ($\tau_f$) was measured at a temperature range from 25° C. to 80° C.

The microwave dielectric characteristics of the samples according to the sintering temperature ranging from 1,100° C. to 1,300° C. are shown in Table 1 and FIG. 1.

TABLE 1

| Example | Sintering temperature (° C.) | Frequency (GHz) | Dielectric constant ($\epsilon_r$) | Quality factor (Q) | Temperature coefficient ($\tau_f$; ppm/° C.) |
|---|---|---|---|---|---|
| 1 | 1,100 | 15.3276 | 11.16 | 902 | −0.3 |
| 2 | 1,150 | 15.0991 | 10.71 | 1,003 | −6.1 |
| 3 | 1,200 | 7.4247 | 11.25 | 2,073 | −13.7 |
| 4 | 1,250 | 13.0001 | 11.99 | 587 | −2.1 |
| 5 | 1,300 | 13.0600 | 11.82 | 652 | −1.4 |

Figure 2:
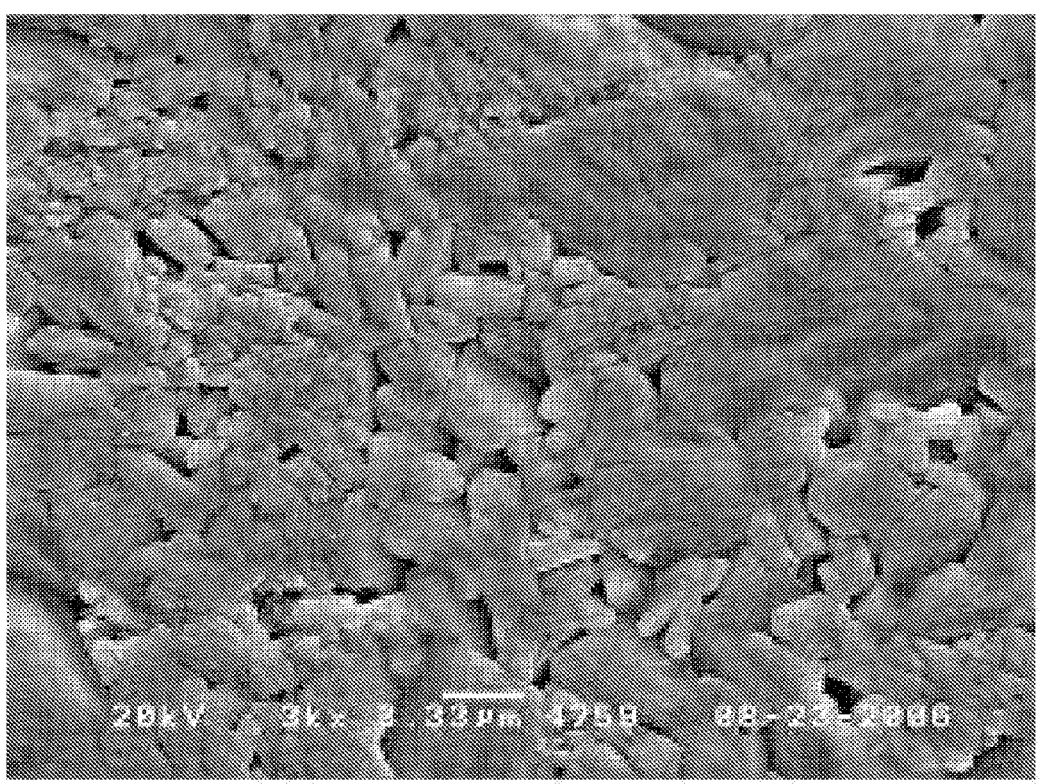
FIG. 2 is a scanning electron microscope (SEM) image of the $BaZr(MO_3)_2$ ceramic of FIG. 1.

Referring to Table 1 and FIG. 1, the BaZr(BO$_3$)$_2$ ceramic sintered at 1,100° C. shows a quality factor of approximately 900 at a frequency of 15 GHz and a dielectric constant of approximately 11. Example 3 sintered for 2 hours at 1,200° C. shows the highest quality factor of 2,073 among the above-listed examples. FIG. 2 shows a SEM image of Example 3.

On the contrary, Examples 4 and 5 shows significantly reduced quality factors as the sintering temperature increases above 1,250° C. This is probably because BaZr(BO$_3$)$_2$ phase is decomposed to generate BaZrO$_3$ phase.

EXAMPLES 6 to 9

In these examples, CaZr(BO$_3$)$_2$ ceramics consisting essentially of the composition of the formula 1 were prepared and microwave dielectric characteristics thereof according to respective sintering temperatures were measured. CaCO$_3$, ZrO$_2$, and B$_2$O$_3$ or H$_3$BO$_3$ were used as starting materials. Sample preparation and measurement procedures were essentially identical to those described in Examples 1 to 5 except the sintering temperature. In these examples, samples were sintered for 2 hours at a temperature from 1,000° C. to 1,150° C.

The microwave dielectric characteristics of the CaZr(BO$_3$)$_2$ ceramics prepared and measured according to these examples are shown in Table 2.

TABLE 2

| Example | Sintering temperature (° C.) | Frequency (GHz) | Dielectric constant ($\epsilon_r$) | Quality factor (Q) | Temperature coefficient ($\tau_f$; ppm/° C.) |
|---|---|---|---|---|---|
| 6 | 1,000 | 16.5118 | — | 1,555 | — |
| 7 | 1,050 | 16.3868 | — | 1,873 | — |
| 8 | 1,100 | 16.1439 | 7.4 | 1,914 | −9.6 |
| 9 | 1,150 | 16.2759 | — | 1,761 | — |

EXAMPLES 10 to 13

In these examples, SrZr(BO$_3$)$_2$ ceramics consisting essentially of the composition of the formula 1 were prepared and microwave dielectric characteristics thereof according to respective sintering temperatures were measured. SrCO$_3$, ZrO$_2$, and B$_2$O$_3$ or H$_3$BO$_3$ were used as starting materials. Sample preparation and measurement procedures were essentially identical to those described in Examples 6 to 9.

The microwave dielectric characteristics of the SrZr(BO$_3$)$_2$ ceramics prepared and measured according to these examples are shown in Table 3.

TABLE 3

| Example | Sintering temperature (° C.) | Frequency (GHz) | Dielectric constant ($\epsilon_r$) | Quality factor (Q) | Temperature coefficient ($\tau_f$; ppm/° C.) |
|---|---|---|---|---|---|
| 10 | 1,000 | 16.5607 | — | 1,002 | — |
| 11 | 1,050 | 16.3841 | — | 1,275 | — |
| 12 | 1,100 | 16.1126 | 7.0 | 2,074 | −9.1 |
| 13 | 1,150 | 15.8069 | — | 933 | — |

EXAMPLES 14 to 17

In these examples, SrSn(BO$_3$)$_2$ ceramics consisting essentially of the composition of the formula 1 were manufactured and microwave dielectric characteristics thereof according to respective sintering temperatures were measured. SrCO$_3$, SnO$_2$, and B$_2$O$_3$ or H$_3$BO$_3$ were used as starting materials. Sample preparation and measurement procedures were essentially identical to those described in Examples 6 to 9.

The microwave dielectric characteristics of the SrSn(BO$_3$)$_2$ ceramics prepared and measured according to these examples are shown in Table 4.

TABLE 4

| Example | Sintering temperature (° C.) | Frequency (GHz) | Dielectric constant ($\epsilon_r$) | Quality factor (Q) | Temperature coefficient ($\tau_f$; ppm/° C.) |
|---|---|---|---|---|---|
| 14 | 1,000 | 17.2340 | — | 665 | — |
| 15 | 1,050 | 16.6507 | — | 1,030 | — |
| 16 | 1,100 | 16.1751 | 7.1 | 1,150 | −3.9 |
| 17 | 1,150 | 15.8567 | — | 960 | — |

EXAMPLES 18 to 21

In these examples, CaSn(BO$_3$)$_2$ ceramics consisting essentially of the composition of the formula 1 were prepared and microwave dielectric characteristics thereof according to respective sintering temperatures were measured. CaCO$_3$, SnO$_2$, and B$_2$O$_3$ or H$_3$BO$_3$ were used as starting materials.

Sample preparation and measurement procedures were essentially identical to those described in Examples 6 to 9.

The microwave dielectric characteristics of the CaSn(BO$_3$)$_2$ ceramics prepared and measured according to these examples are shown in Table 5.

TABLE 5

| Example | Sintering temperature (° C.) | Frequency (GHz) | Dielectric constant ($\epsilon_r$) | Quality factor (Q) | Temperature coefficient ($\tau_f$: ppm/° C.) |
|---|---|---|---|---|---|
| 18 | 1,000 | 17.7197 | — | 480 | — |
| 19 | 1,050 | 17.4157 | — | 567 | — |
| 20 | 1,100 | 17.2590 | 5.6 | 790 | −4.6 |
| 21 | 1,150 | 16.9775 | — | 640 | — |

EXAMPLES 22 to 29

In these examples, Ba(Zr$_{1-x}$Ti$_x$)B$_2$O$_6$ (where 0<x<1) ceramics consisting essentially of the composition of the formula 3 were prepared and microwave dielectric characteristics thereof according to respective sintering temperatures were measured. BaCO$_3$, ZrO$_2$, TiO$_2$, and B$_2$O$_3$ or H$_3$BO$_3$ were used as starting materials. Sample preparation and measurement procedures were essentially identical to those described in Examples 6 to 9.

Figure 3:
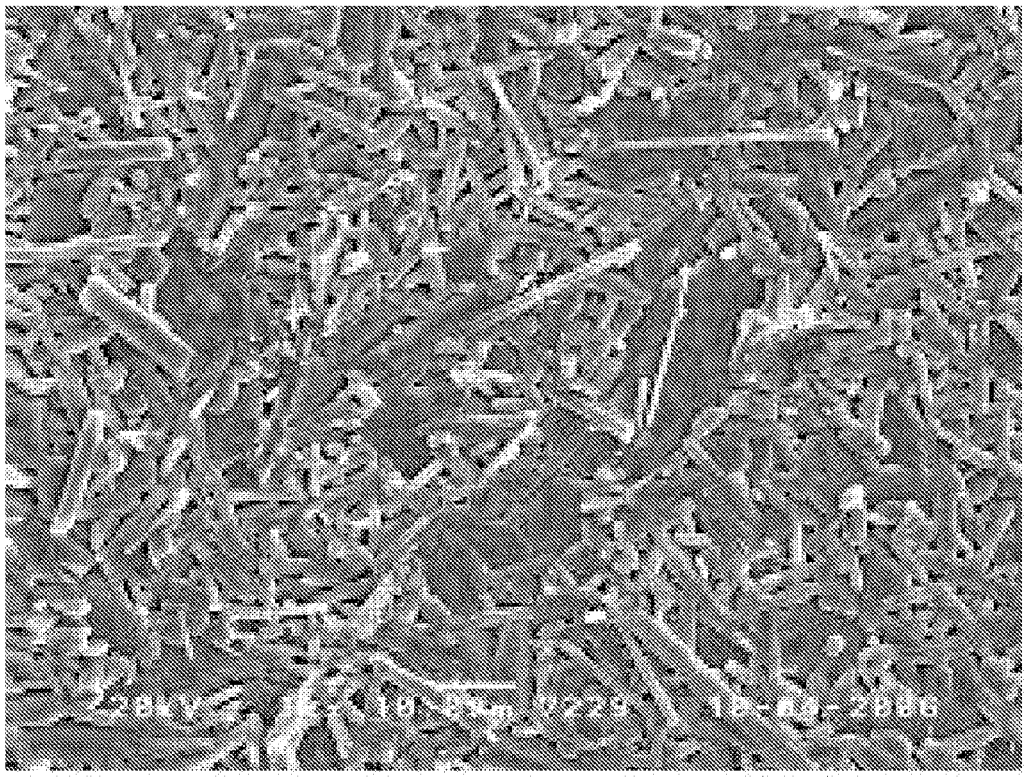
FIG. 3 is a SEM image of $Ba(Zr_{1-x}Ti_x)B_2O_6$ ceramic sintered for 2 hours at 1,050° C. in accordance with another exemplary embodiment.

The microwave dielectric characteristics of the Ba(Zr,Ti)B$_2$O$_6$ ceramics according to respective mole fractions of Zr/Ti and respective sintering temperatures are shown in Table 6. A SEM image of Example 22 sintered for 2 hours at 1,050° C. is shown in FIG. 3.

TABLE 6

| Example | Composition (Zr/Ti) | Sintering temperature (° C.) | Frequency (GHz) | Dielectric constant ($\epsilon_r$) | Quality factor (Q) | Temperature coefficient ($\tau_f$: ppm/° C.) |
|---|---|---|---|---|---|---|
| 22 | 1/1 | 1,050 | 11.9261 | 12.82 | 2,250 | −31 |
| 23 | 1/1 | 1,100 | 12.1784 | 12.00 | 690 | −23 |
| 24 | 1/1 | 1,150 | 12.4252 | 11.28 | 366 | −46 |
| 25 | 1/3 | 1,075 | 7.0213 | 12.14 | 978 | — |
| 26 | 3/1 | 1,100 | 7.2338 | 12.06 | 1,676 | — |

In addition, low frequency dielectric characteristics of Examples 22 to 24 of Ba(Zr$_{1/2}$Ti$_{1/2}$)B$_2$O$_6$ ceramics sintered at 1,050° C., 1,100° C. and 1,150° C., respectively, were measured. These are shown in Table 7, as Examples 27 to 29.

TABLE 7

| Example | Sintering temperature (° C.) | Frequency (MHz) | Dielectric constant ($\epsilon_r$) | Dielectric loss (tan δ) | Temperature coefficient ($\tau_f$: ppm/° C.) |
|---|---|---|---|---|---|
| 27 | 1,050 | 1 | 12.66 | 1.8 × 10$^{-4}$ | — |
| 28 | 1,100 | 1 | 12.05 | 8 × 10$^{-4}$ | — |
| 29 | 1,150 | 1 | 11.96 | 13.3 × 10$^{-4}$ | — |

EXAMPLES 30 to 33

In these examples, Ba(Sn$_{1-x}$Zr$_x$)B$_2$O$_6$ (where 0<x<1) ceramics consisting essentially of the composition of the formula 3 were prepared and microwave dielectric characteristics thereof according to respective sintering temperatures were measured. BaCO$_3$, SnO$_2$, ZrO$_2$, and B$_2$O$_3$ or H$_3$BO$_3$ were used as starting materials. Sample preparation and measurement procedures were essentially identical to those described in Examples 6 to 9.

The microwave dielectric characteristics of the Ba(Sn,Zr)B$_2$O$_6$ ceramics according to respective mole fractions of Sn/Zr and respective sintering temperatures are shown in Table 8.

TABLE 8

| Example | Composition (Sn/Zr) | Sintering temperature (° C.) | Frequency (GHz) | Dielectric constant ($\epsilon_r$) | Quality factor (Q) | Temperature coefficient ($\tau_f$: ppm/° C.) |
|---|---|---|---|---|---|---|
| 30 | 1/3 | 1,100 | 8.1937 | 9.33 | 173 | — |
| 31 | 1/1 | 1,100 | 13.9786 | 9.74 | 1,072 | — |
| 32 | 1/1 | 1,150 | 13.7750 | 10.24 | 1,215 | — |
| 33 | 3/1 | 1,100 | 8.2366 | 9.48 | 1,094 | — |

EXAMPLES 34 to 37

In these examples, a low temperature sintering agent including CuO and Bi$_2$O$_3$ was added to BaZr(BO$_3$)$_2$ ceramics of Examples 1 to 5 in order to manufacture ceramic materials that can be sintered at a low temperature below 1,000° C.

Figure 4:
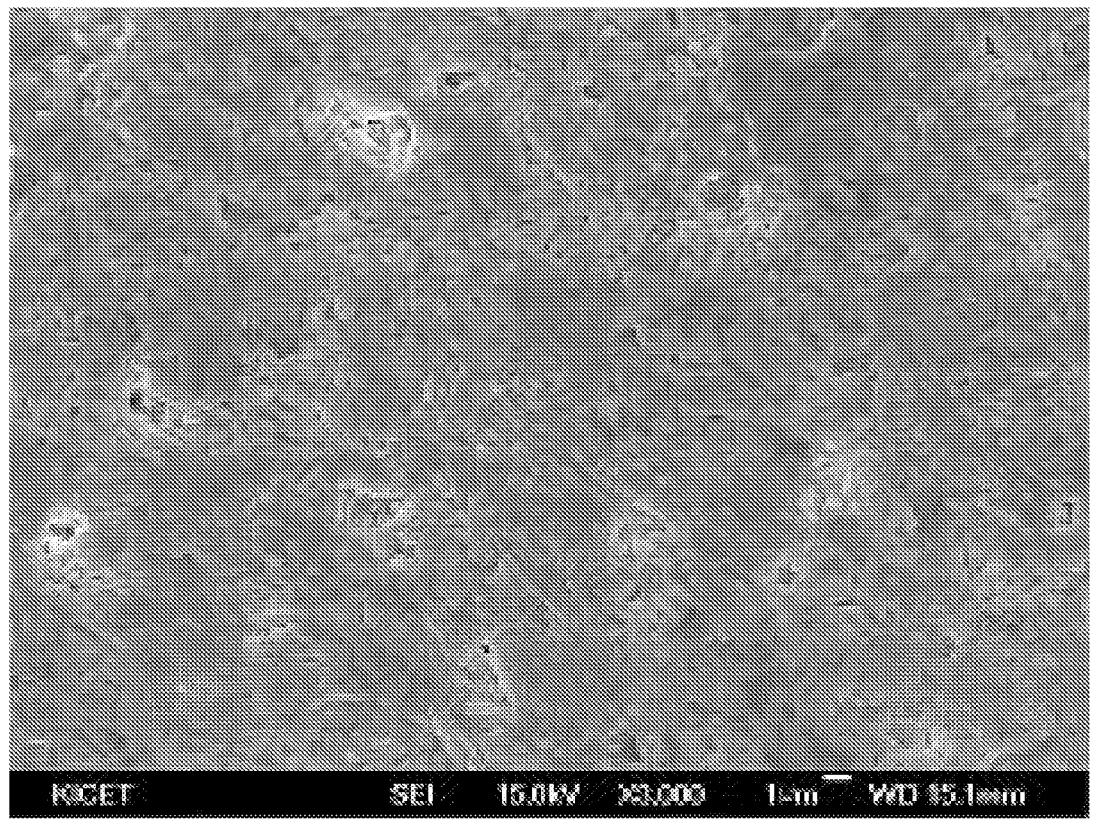
FIG. 4 is a SEM image of $BaZr(BO_3)_2$ ceramic added with 5 wt % of $0.88Bi_2O_3$-$0.12CuO$ as a sintering agent, and sintered for 2 hours at 900° C. in accordance with further another exemplary embodiment.

In specific, reagents CuO and Bi$_2$O$_3$ were weighed to form a sintering aid having the composition of formula 5. Then, the BaZr(BO$_3$)$_2$ powders calcinated and synthesized as described in Examples 1 to 5 were added with from 1 wt % to 7 wt % of the sintering aids having the composition of 0.12CuO+0.88Bi$_2$O$_3$. Thereafter, sample preparation and measurement procedures are performed, which are identical to those of Examples 1 to 5 after the calcination. However, the sintering conditions were not identical to those of Examples 1 to 5. Instead, the sintering was performed for 2 hours at a temperature from 875° C. to 925° C. Table 9 shows microwave dielectric characteristics of the BaZr(BO$_3$)$_2$ ceramics added with 5 wt % of the sintering aids having the composition of 0.12CuO+0.88Bi$_2$O$_3$. FIG. 4 shows a SEM image thereof when sintering was performed for 2 hours at 900° C.

TABLE 9

| Example | Frequency | Sintering temperature (° C.) | Dielectric constant ($\epsilon_r$) | Dielectric loss (tan δ) or Quality factor (Q) | Temperature coefficient (ppm/° C.) | Measurement method |
|---|---|---|---|---|---|---|
| 34 | 1 MHz | 875 | 11.35 | 3 × 10$^{-5}$ (tan δ) | — | Impedance analyzer |

TABLE 9-continued

| Example | Frequency | Sintering temperature (° C.) | Dielectric constant ($\epsilon_r$) | Dielectric loss (tan δ) or Quality factor (Q) | Temperature coefficient (ppm/° C.) | Measurement method |
|---|---|---|---|---|---|---|
| 35 | 1 MHz | 900 | 11.50 | $7 \times 10^{-5}$ (tan δ) | — | |
| 36 | 1 MHz | 925 | 11.51 | $1 \times 10^{-5}$ (tan δ) | — | |
| 37 | 16 GHz | 900 | 11.80 | 880 (Q) | +1.1 | Network analyzer |

Referring to Table 9 and FIG. 4, the BaZr(BO$_3$)$_2$ ceramic that is added with 5 wt % of the sintering agent having the composition of 0.12CuO+0.88Bi$_2$O$_3$ and sintered for 2 hours at 900° C. shows a dielectric constant of 11.8, a quality factor of 880, and a temperature coefficient of approximately 1 ppm/° C. Accordingly, the ceramic shows superior microwave dielectric characteristics although the sintering temperature is lowered to 900° C.

EXAMPLES 38 to 43

In these examples, BaSnB$_2$O$_6$, CaZrB$_2$O$_6$, SrZrB$_2$O$_6$, BaZrB$_2$O$_6$, CaSnB$_2$O$_6$, and SrSnB$_2$O$_6$ ceramics consisting essentially of the composition of the formula 1 were prepared and microwave dielectric characteristics thereof according to respective sintering temperatures were measured. Sample preparation and measurement procedures were essentially identical to those described in Examples 1 to 5 except the sintering temperature. The sintering temperature was fixed to 1,100° C.

In addition, BaSnB$_2$O$_6$, CaZrB$_2$O$_6$, SrZrB$_2$O$_6$, BaZrB$_2$O$_6$, CaSnB$_2$O$_6$, and SrSnB$_2$O$_6$ ceramic powders calcinated and synthesized as described in Examples 1 to 5 were prepared. Then, the ceramic powders were added with 5% of sintering agents having the composition of 0.12CuO+0.88Bi$_2$O$_3$, and sintered at 900° C., respectively. Other procedures were essentially identical to those described in Examples 1 to 5.

The microwave dielectric characteristics of the samples prepared and measured as described above are shown and compared in Table 10. In Table 10, BC refers to the sintering agent having the composition of 0.12CuO+0.88Bi$_2$O$_6$.

TABLE 10

| | | Microwave dielectric characteristics | | | |
|---|---|---|---|---|---|
| | | | Quality factor (Q) (Frequency: 16 GHz) | | |
| Example | Composition | Dielectric constant ($\epsilon_r$) | Without BC (sintering at 1,100° C.) | 5 wt % BC added (sintering at 900° C.) | Temperature coefficient ($\tau_f$: ppm/° C.) |
| 38 | BaSnB$_2$O$_6$ | 9.8 | 850 | 350 | −45 |
| 39 | CaZrB$_2$O$_6$ | 7.4 | 1,910 | 1,880 | −9.6 |
| 40 | SrZrB$_2$O$_6$ | 7.0 | 2,070 | 1,390 | −9.1 |
| 41 | BaZrB$_2$O$_6$ | 11.6 | 1,200 | 902 | −0.3 |
| 42 | CaSnB$_2$O$_6$ | 5.6 | 790 | 1,560 | −4.6 |
| 43 | SrSnB$_2$O$_6$ | 7.1 | 1,150 | 1,310 | −3.9 |

EXAMPLES 44 to 46

In these examples, (Ba$_{1-x}$Ca$_x$)ZrB$_2$O$_6$ (where 0<x<1) ceramics consisting essentially of the composition of the formula 2 were prepared and microwave dielectric characteristics thereof were measured. BaCO$_3$, CaCO$_3$, ZrO$_2$, and B$_2$O$_3$ or H$_3$BO$_3$ were used as starting materials. Sample preparation and measurement procedures were essentially identical to those described in Examples 6 to 9.

The microwave dielectric characteristics of the (Ba$_{1-x}$Ca$_x$)ZrB$_2$O$_6$ ceramics according to respective mole fractions of Ba/Ca and respective sintering temperatures are shown in Table 11.

TABLE 11

| Example | Composition (Ba/Ca) | Frequency | Sintering temperature (° C.) | Dielectric constant ($\epsilon_r$) | Quality factor (Q) | Temperature coefficient (ppm/° C.) |
|---|---|---|---|---|---|---|
| 44 | 1/1 | 100 MHz | 1,075 | 11.59 | 1960 | — |
| 45 | 1/3 | 100 MHz | 1,075 | 13.29 | 1738 | — |
| 46 | 3/1 | 100 MHz | 1,075 | 10.17 | 1670 | — |

EXAMPLES 47

In this example, (Ba$_{1-x}$Ca$_x$)(Zr$_{1-y}$Ti$_y$)B$_2$O$_6$ (where 0<x<1, 0<y<1) ceramic consisting essentially of the composition of the formula 4 was manufactured and microwave dielectric characteristics thereof were measured. BaCO$_3$, CaCO$_3$, ZrO$_2$, TiO$_2$, and B$_2$O$_3$ or H$_3$BO$_3$ were used as starting materials. Sample preparation and measurement procedures were essentially identical to those described in Examples 6 to 9.

The microwave dielectric characteristics of the (Ba$_{1-x}$Ca$_x$)(Zr$_{1-y}$Ti$_y$)B$_2$O$_6$ ceramics according to mole fractions of Ba/Ca and Zr/Ti and a sintering temperature are shown in Table 12.

TABLE 12

| Example | Composition (Ba/Ca and Zr/Ti) | Frequency | Sintering temperature (° C.) | Dielectric constant ($\epsilon_r$) | Quality factor (Q) | Temperature coefficient (ppm/° C.) |
|---|---|---|---|---|---|---|
| 47 | 1/1 | 100 MHz | 1,000 | 13.17 | 130 | — |

EXAMPLES 48 to 50

In these examples, (Ba$_{1-x}$Ca$_x$)ZrB$_2$O$_6$, Ba(Zr$_{1-x}$Ti$_x$)B$_2$O$_6$, and (Ba$_{1-x}$Ca$_x$)(Zr$_{1-y}$Ti$_y$)B$_2$O$_6$ (where 0<x<1, 0<y<1) ceramics consisting essentially of the compositions of the formulas 2 to 4, respectively, were prepared. Then, the ceramics were added with 3 wt % of the sintering agents having the composition of 0.12CuO+0.88Bi$_2$O$_3$, and sintered at a temperature from 900° C. to 925° C. The microwave dielectric characteristics of the samples prepared and measured as described above are shown in Table 13.

TABLE 13

| Example | Composition | Frequency | Sintering temperature (° C.) | Dielectric constant ($\epsilon_r$) | Quality factor (Q) | Temperature coefficient (ppm/° C.) |
|---|---|---|---|---|---|---|
| 48 | $(Ba_{1/2}Ca_{1/2})ZrB_2O_6$ + 3 wt % $(0.88Bi_2O_3 + 0.12CuO)$ | 100 MHz | 925 | 14.09 | 1570 | — |
| 49 | $Ba(Zr_{1/2}Ti_{1/2})B_2O_6$ + 3 wt % $(0.88Bi_2O_3 + 0.12CuO)$ | 100 MHz | 925 | 15.82 | 320 | — |
| 50 | $(Ba_{1/2}Ca_{1/2})(Zr_{1/2}Ti_{1/2})B_2O_6$ + 3 wt % $(0.88Bi_2O_3 + 0.12CuO)$ | 100 MHz | 925 | 17.24 | 210 | — |

As described above, the ceramics consisting essentially of the compositions of the formulas 1 to 4 and added with the $Bi_2O_3$—CuO based sintering agent can be sintered at a low temperature ranging from 900° C. to 925° C. without significant deterioration of dielectric characteristics. As such, the ceramics in accordance with the exemplary embodiments of the present invention can be used as an excellent material for a capacitor, a microwave LTCC device and a substrate including silver or copper as an internal electrode.

It will be obvious to those skilled in the art that the sintering temperature for optimum microwave dielectric characteristics may be varied slightly, within an acceptable error range, according to characteristics of a powder, such as average particle size, distribution and specific surface, purity of a starting material, impurity content, and sintering condition.

Although the glass-free microwave dielectric ceramics and manufacturing method thereof have been described with reference to the specific embodiments, they are not limited thereto. Therefore, it will be readily understood by those skilled in the art that various modifications and changes can be made thereto without departing from the spirit and scope of the present invention defined by the appended claims.

The invention claimed is:

1. A dielectric ceramic composition, comprising a composition represented by a formula:

$$(M_{1-x}^{2+}M'_x{}^{2+})N^{4+}B_2O_6,$$

wherein
M and M' are different from each other, each being one among Ba, Ca and Sr;
N is one among Sn, Zr and Ti; and
$0<x<1$.

2. A dielectric ceramic composition, comprising a composition represented by a formula:

$$M^{2+}(N_{1-y}^{4+}N'_y{}^{4+})B_2O_6$$

wherein
M is one among Ba, Ca and Sr;
N and N' are different from each other, each being one among Sn, Zr and Ti; and
$0<y<1$.

3. A dielectric ceramic composition, comprising a composition represented by a formula:

$$(M_{1-x}^{2+}M'_x{}^{2+})(N_{1-y}^{4+}N'_y{}^{4+})B_2O_6,$$

wherein
M and M' are different from each other, each being one among Ba, Ca and Sr;
N and N' are different from each other, each being one among Sn, Zr and Ti;
$0<x<1$; and
$0<y<1$.

4. The dielectric ceramic composition of claim 1 further comprising a sintering aid including CuO and $Bi_2O_3$.

5. The dielectric ceramic composition of claim 1 further comprising a sintering aid represented by a formula:

$$0.12CuO+0.88Bi_2O_3.$$

6. The dielectric ceramic composition of claim 4, wherein the content of the sintering aid in the dielectric ceramic composition is from 1 wt % to 7 wt %.

7. The dielectric ceramic composition of claim 2, further comprising a sintering aid including CuO and $Bi_2O_3$.

8. The dielectric ceramic composition of claim 3, further comprising a sintering aid including CuO and $Bi_2O_3$.

9. The dielectric ceramic composition of claim 2, further comprising a sintering aid represented by a formula:

$$0.12CuO+0.88Bi_2O_3.$$

10. The dielectric ceramic composition of claim 3, further comprising a sintering aid represented by a formula:

$$0.12CuO+0.88Bi_2O_3.$$

11. The dielectric ceramic composition of claim 7, wherein the content of the sintering aid in the dielectric ceramic composition is from 1 wt % to 7 wt %.

12. The dielectric ceramic composition of claim 8, wherein the content of the sintering aid in the dielectric ceramic composition is from 1 wt % to 7 wt %.

* * * * *